United States Patent [19]
Okubo et al.

[11] Patent Number: 5,641,960
[45] Date of Patent: Jun. 24, 1997

[54] CIRCUIT PATTERN INSPECTING DEVICE AND METHOD AND CIRCUIT PATTERN ARRANGEMENT SUITABLE FOR THE METHOD

[75] Inventors: Kazuo Okubo; Masafumi Asai, both of Kawasaki, Japan

[73] Assignee: Fujitsu Limited, Kawasaki, Japan

[21] Appl. No.: 336,659

[22] Filed: Nov. 4, 1994

[30] Foreign Application Priority Data

Jan. 13, 1994 [JP] Japan ................................. 6-002215

[51] Int. Cl.⁶ ........................... H01J 37/28; G01B 11/00; G06K 5/00
[52] U.S. Cl. ..................... 250/310; 250/307; 356/398; 382/144; 382/149
[58] Field of Search ........................ 250/310, 307; 356/398; 382/144, 149

[56] References Cited

U.S. PATENT DOCUMENTS

| | | | |
|---|---|---|---|
| 4,347,001 | 8/1982 | Levy et al. | 356/398 |
| 5,399,860 | 3/1995 | Miyoshi et al. | 250/310 |

FOREIGN PATENT DOCUMENTS

| | | | |
|---|---|---|---|
| 2830846 | 1/1979 | Germany | 356/398 |
| 56-050513 | 5/1981 | Japan . | |
| 02-003254 | 1/1990 | Japan . | |

Primary Examiner—Jack I. Berman
Attorney, Agent, or Firm—Staas & Halsey

[57] ABSTRACT

A circuit pattern inspection device includes a stage on which circuit patterns to be inspected are arranged so as to be symmetrical about a center of the stage about which the stage can rotate, a plurality of sensors which are positioned with respect to the center and scan the circuit patterns, and a signal processing circuit which determines whether or not the circuit patterns are normal on the basis of output signals of the plurality of sensors.

14 Claims, 15 Drawing Sheets

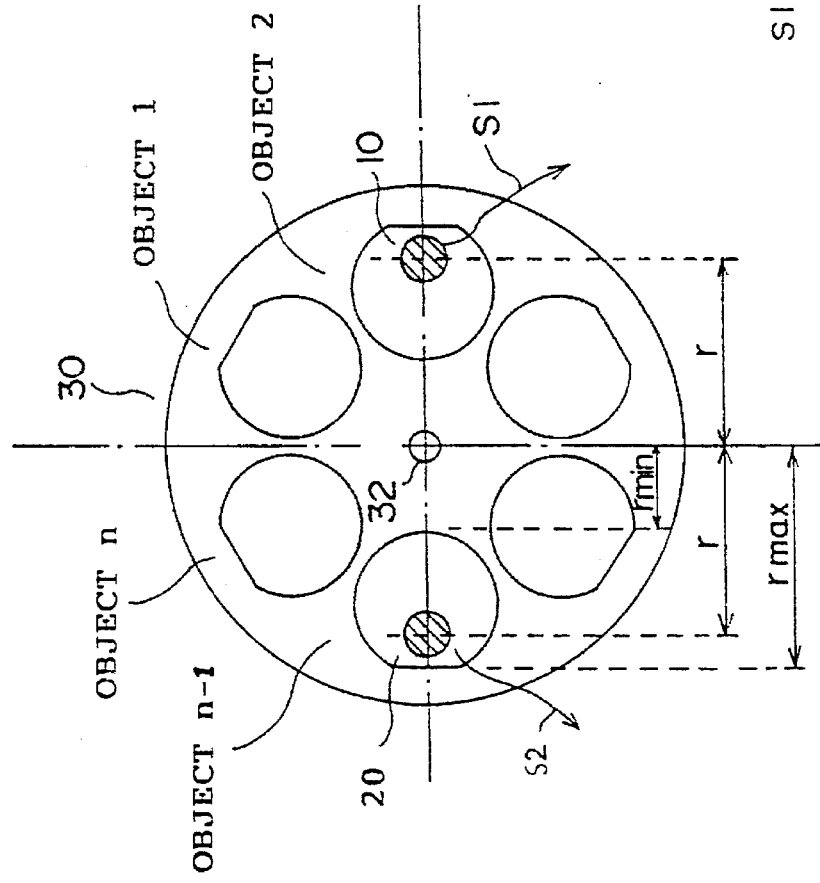

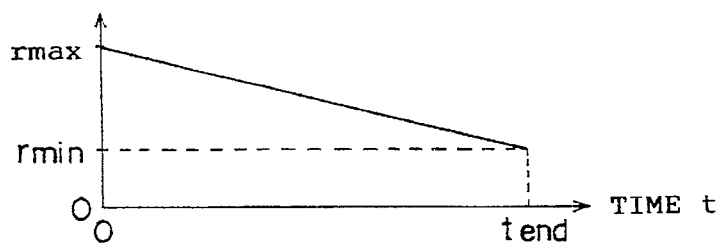
FIG. 2A SENSOR POSITION r
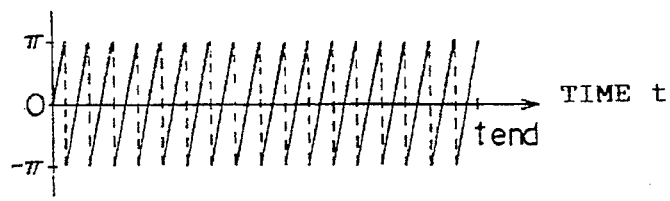
FIG. 2B STAGE ROTATION ANGLE θ
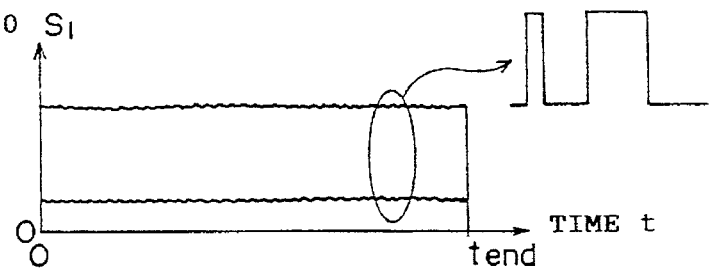
FIG. 2C OUTPUT OF SENSOR 10 $S_1$
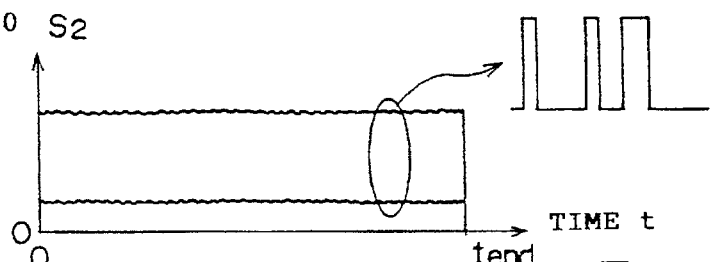
FIG. 2D OUTPUT OF SENSOR 20 $S_2$
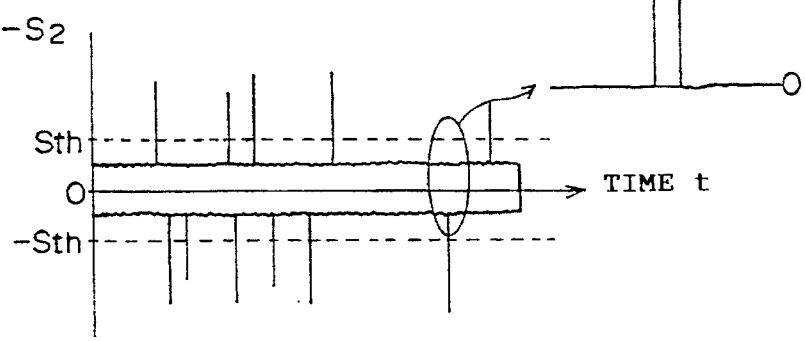
FIG. 2E $S_1-S_2$ $$\text{defx} \propto -\delta r + R\sin\varphi\delta\theta + \cos\varphi\delta x - \sin\varphi\delta y$$
$$\text{defy} \propto r\delta\varphi + (r - R\cos\varphi)\delta\theta + \sin\varphi\delta x + \cos\varphi\delta y$$

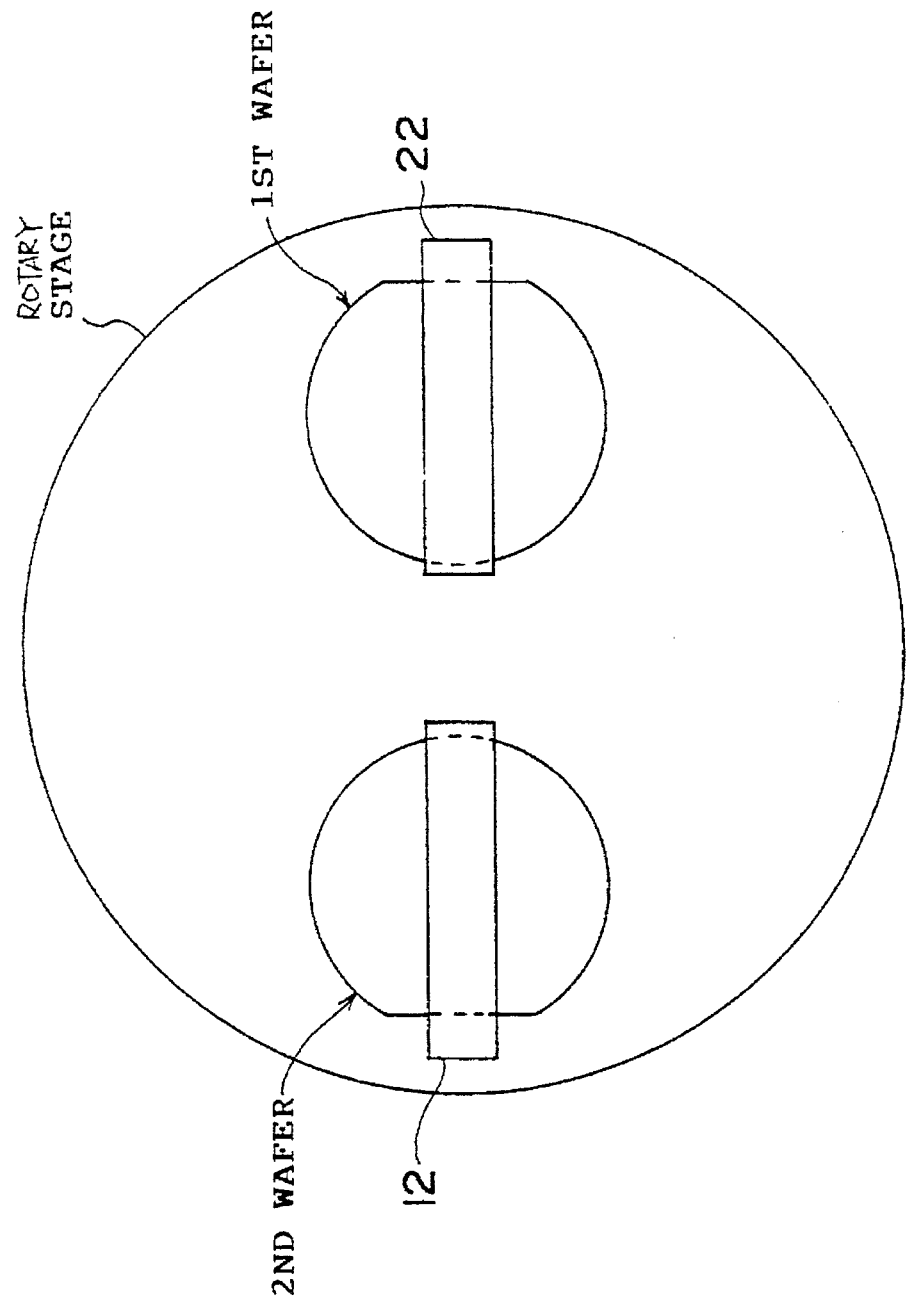

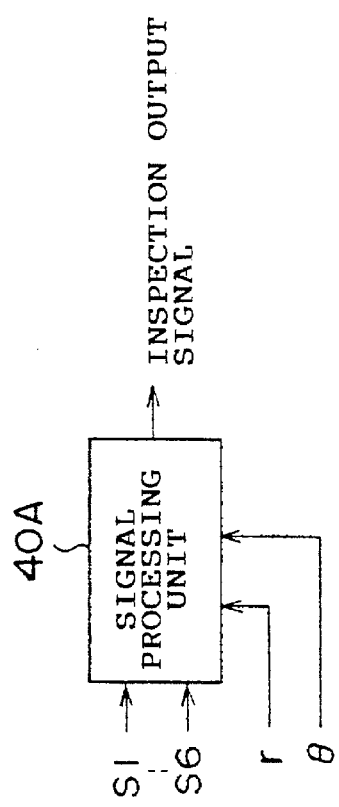
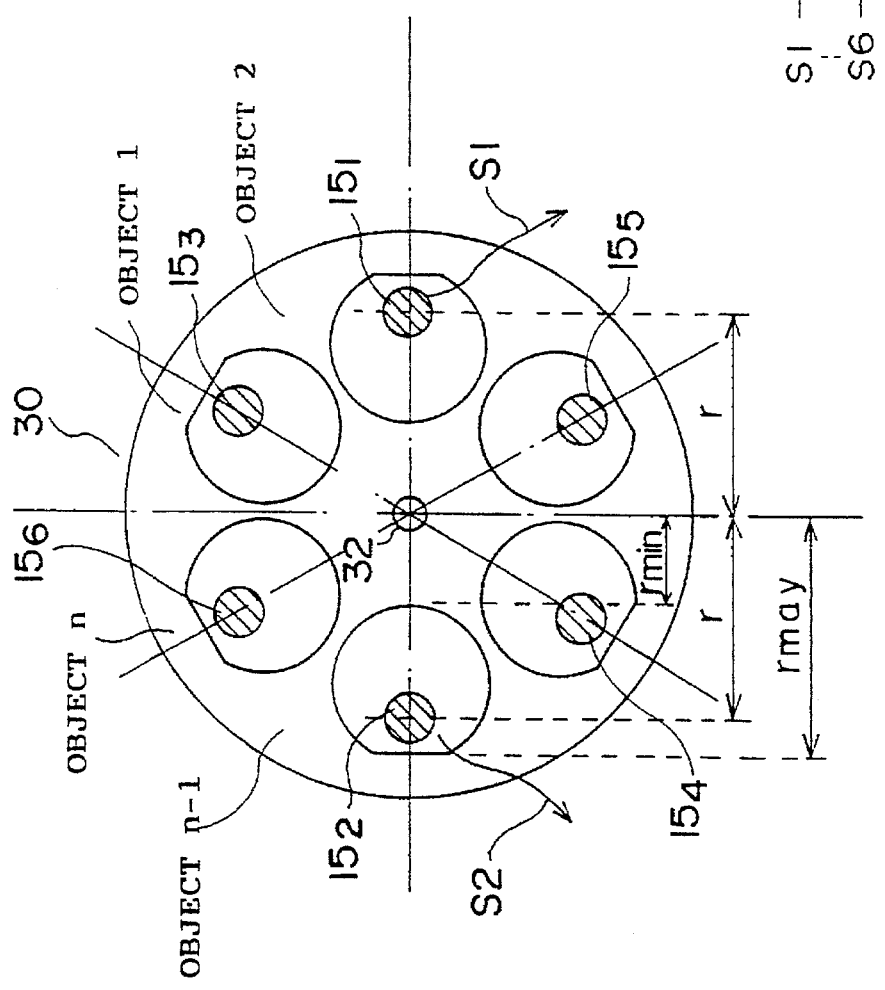

CIRCUIT PATTERN INSPECTING DEVICE AND METHOD AND CIRCUIT PATTERN ARRANGEMENT SUITABLE FOR THE METHOD

BACKGROUND OF THE INVENTION

1. Field of the Invention

The present invention relates to a pattern inspection carried out in the process of producing semiconductor integrated circuit devices.

2. Description of the Prior Art

Recently, it has become difficult to inspect circuit patterns of integrated circuits and to inspect a mask and a reticle used to draw circuit patterns by exposure as the integration density has increased.

A conventional pattern inspection uses a scanning-type electron microscope (SEM) by which circuit patterns are observed. The observation results are compared with the results of observation of normal patterns stored in a memory beforehand, or are compared with data stored in a database. Normally, a low acceleration voltage equal to or lower than 1 kV is used in the observation using the scanning-type electron microscope in order to avoid charging up.

However, the use of such a low acceleration voltage makes it difficult to reduce the size of the electron beam and obtain a large beam current while obtaining a wide field of view.

Recently, an electron microscope has been proposed which has a reduced lens cylinder or barrel in order to simultaneously realize a reduced size of the electron beam and an increased beam current. However, such a proposed electron microscope has a difficulty in the formation of a wide field of view and needs an increased number of movement steps of the stage. This prevents speeding up of the inspection.

SUMMARY OF THE INVENTION

It is a general object of the present invention to eliminate the above disadvantages of the prior art.

A more specific object of the present invention is to provide an inspection device and method capable of inspecting fine circuit patterns at high speed and to provide a circuit pattern arrangement suitable for the method.

The above objects of the present invention are achieved by a circuit pattern inspection device comprising: a stage on which circuit patterns to be inspected are arranged so as to be symmetrical about a center of the stage about which the stage can rotate; a plurality of sensors which are positioned with respect to the center and which scan the circuit patterns; and a signal processing circuit which determines whether or not the circuit patterns are normal on the basis of output signals of the plurality of sensors.

The above objects of the present invention are achieved by a method for inspecting circuit patterns comprising the steps of: (a) rotating a stage on which circuit patterns to be inspected are arranged so as to be symmetrical about a center of the stage; (b) scanning the circuit patterns by a plurality of sensors which are positioned with respect to the center; and (c) determining whether or not the circuit patterns are normal on the basis of output signals of a plurality of sensors.

The above objects of the present invention are also achieved by a circuit pattern arrangement comprising a plurality of circuit patterns arranged so as to be symmetrical about a center of a member; and the member comprising one of a wafer, a mask for exposure, a reticle or a printed circuit board.

BRIEF DESCRIPTION OF THE DRAWINGS

Other objects, features and advantages of the present invention will become more apparent from the following detailed description when read in conjunction with the accompanying drawings, in which:

FIGS. 1A and 1B are diagrams of the principle of the present invention;

FIGS. 2A, 2B, 2C, 2D and 2E are timing charts of the operation of the device shown in FIGS. 1A and 1B;

FIG. 16 is a diagram of another embodiment of the present invention;

FIG. 17A is a diagram of yet another embodiment of the present invention; and

FIG. 17B is a diagram of the above yet another embodiment of the present invention.

DESCRIPTION OF THE PREFERRED EMBODIMENTS

Figure 3:
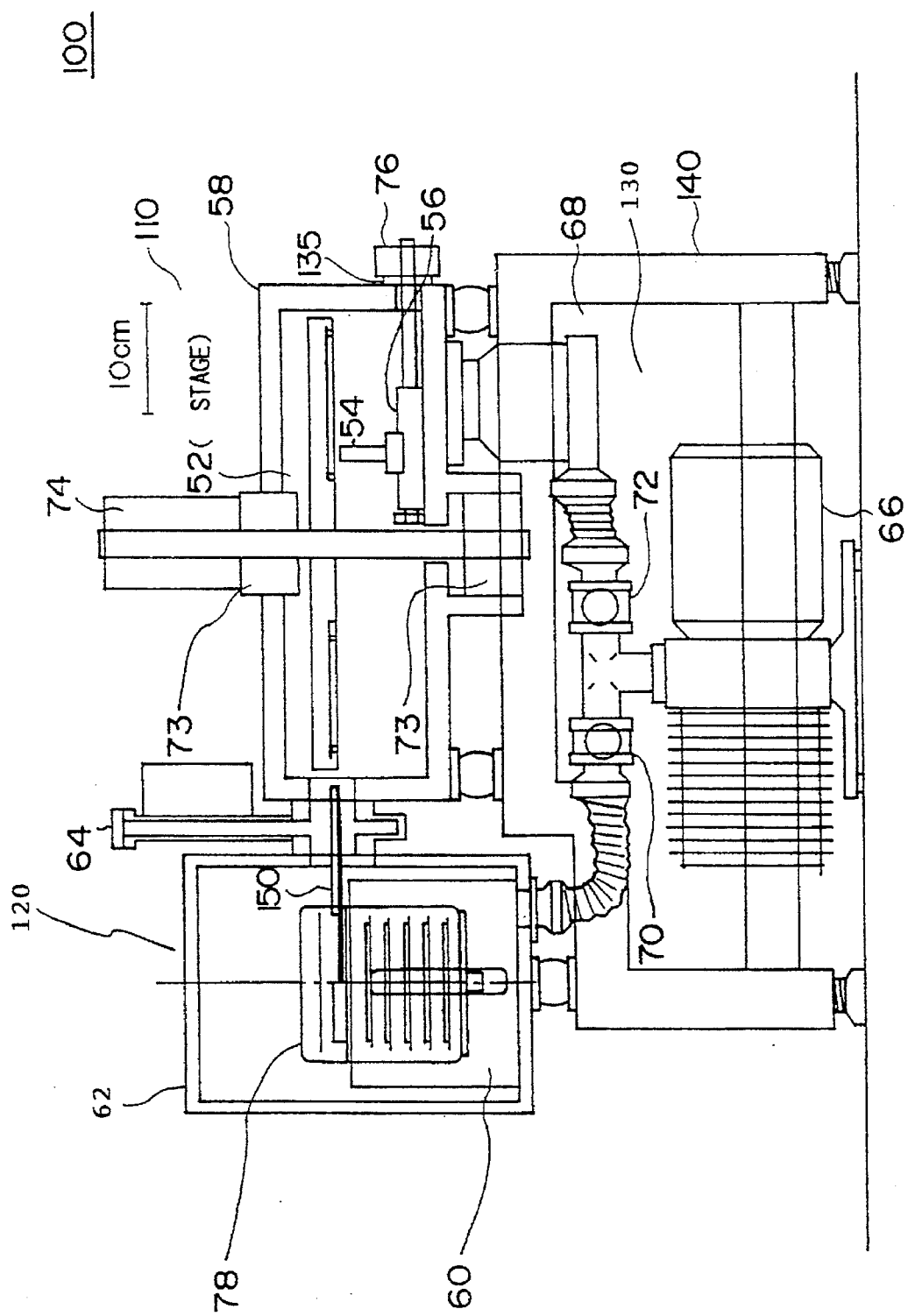
FIG. 3 is a side view of a mechanical structure system according to an embodiment of the present invention, the side view having a partially cutaway cross-sectional view.

FIGS. 1A and 1*b* are diagrams of the principle of the present invention. Objects 1–n to be inspected are placed on a rotary stage 30 rotatable about a rotary shaft (center) 32 so that the objects 1–n are symmetrical about the rotary shaft 32. In FIG. 1A, the objects 1–n to be inspected are semiconductor wafers, which are arranged so that the respective orientation-flat portions face outward. A pair of sensors, a first sensor 10 and a second sensor 20, are movably provided in the radial directions of the rotary stage 30 passing through the rotary shaft 32. More particularly, the first sensor 10 and the second sensor 20 can be linearly moved at an equal speed between a closed position rmin and a furthest position rmax with respect to the rotary shaft 32. When inspecting the wafers 1–n, the first sensor 10 and the second sensor 20 are moved outward in the opposite directions so as to be positioned at an equal distance r from the rotary shaft 32, and observe the two respective wafers to be inspected (wafers 2 and n–1 in FIG. 1A). A signal processing circuit 40 compares output signals S1 and S2 of the first sensor 10 and the second sensor 20 with each other, and determines whether or not the circuit patterns are normal on the basis of the comparison results. Then, the signal processing circuit 40 produces a signal indicating the determination results.

The present invention is not limited to use of two sensors. It is possible to use sensors equal in number to the number of the objects or less. These sensors are movably provided in the radial directions of the rotary stage 30 passing through the rotary shaft 32.

FIGS. 2A through 2E are waveform diagrams showing the operation of the structure shown in FIGS. 1A and 1B.

As shown in FIG. 2A, during a duration between time 0 and time tend, the first sensor 10 and the second sensor 20 are moved from the position rmax to the position rmin at a constant speed. As shown in FIG. 2B, the stage 30 is rotated at a constant speed. FIG. 2C shows the waveform of the output signal S1 of the first sensor 10 during the above duration, and FIG. 2D shows the waveform of the output signal S2 of the second sensor 20 during the above duration. The n objects to be inspected have an identical circuit pattern, and thus the waveforms of the output signals S1 and S2 of the first sensor 10 and the second sensor 20 will be the same as each other if the circuit patterns being inspected are normal. FIGS. 2C and 2D also show enlarged waveform portions, in which at least one of the two patterns being inspected is defective and the two waveforms do not coincide with each other.

FIG. 2E shows the operation of the signal processing circuit 40 shown in FIGS. 1A and 1B. The output signals S1 and S2 greatly fluctuate during the duration between the scan starting time (t=0) and the scan end time (t=tend). However, the difference between the output signals S1 and S2 falls within the range defined by threshold levels Sth and –Sth if the two patterns being inspected are normal. If at least one of the two patterns being inspected is defective, the difference between the output signals S1 and S2 exceeds either the threshold level Sth or the threshold level –Sth. In this case, it is concluded that at least one of the two patterns being inspected is defective. The positions of the patterns at that time can be identified by the sensor position r and the rotating angle φ of the rotary stage 30.

In the operation shown in FIG. 2E, the difference between the output signals S1 and S2 (S1–S2) is compared with the threshold levels ±Sth in order to determine whether or not there is a defective pattern. However, the present invention is not limited to the above operation. For example, the output signals S1 and S2 are converted into digital signals such as two-valued or three-valued signals, which are then compared with each other. Further, circuit patterns in a single wafer can be inspected, as will be described later.

With the above structure, it becomes possible to use scanning-type electron microscopes having reduced lens cylinders as the first sensor 10 and the second sensor 20. For example, it will be now assumed that a circuit pattern is inspected with a resolution of 0.05 µm. In the scanning-type electron microscope having a reduced lens cylinders, the deflection of the electron beam is applied only to correction of the position of the electron beam. When the inspection is carried out at a rate of 50 MHz, the revolution speed N (rps) and the movement speed V (µm/s) of the first sensor 10 and the second sensor 20 are selected as follows in order to obtain a resolution of 0.05 µm in a case where the sensors 10 and 20 are located on the circumference having a diameter of 8 inches:

$$N = (50 \times 10^6 \times 0.05 \times 10^{-6})/\pi \times 8 \text{ (inches)}$$
$$= 4.05$$
$$V = 2 \times N \times 0.05 \times 10^{-6} \text{ (m/s)}$$
$$= 0.4 \text{ (µm/s)}$$

That is, the first sensor 10 and the second sensor 20 are moved at a speed of 0.4 (µm/s) every four revolutions of the rotary stage 30. By rotating the objects to be inspected and slowly moving the first sensor 10 and the second sensor 20, it is possible to carry out a pattern inspection at a resolution of 0.05 µm without any deflection of the electron beam.

A rate higher than 50 MHz can be obtained by increasing the revolution speed of the rotary stage 30 and/or the number of pairs of sensors.

A description will now be given of an embodiment of the present invention, which is an inspection device which can inspect 5-inch wafers and electron beam converging lens cylinders having built-in secondary electron (reflected electron) detectors, these lens cylinders serving as the first sensor 10 and the second sensor 20.

Mechanical Structure System 100

FIG. 3 is a diagram of a mechanical structure system 100 of the inspection device.

The mechanical structure system 100 is made up of an inspection mechanism 110, a load lock mechanism 120, a vacuum exhaust mechanism 130, and a frame 140. The inspection mechanism 110 includes a rotary stage 52, a sensor 54, a sensor stage 56 and a sample chamber (high vacuum chamber) 58. The load lock mechanism 120 includes a wafer load mechanism 60, a load lock chamber 62 and a gate valve 64. The vacuum exhaust mechanism 130 includes a rotary pump 66, a turbo molecular pump 68, a first valve 70 and a second valve 72. The frame 140 supports the overall structure of the inspection device. For the sake of simplicity, the other sensor is not illustrated.

The inspection mechanism 110 is provided in the sample chamber (high vacuum chamber) 58. The inspection mechanism 110 is connected to the load lock chamber 62 via the gate valve 64, and is exhausted to very high vacuum by the turbo pump 68. It is easily possible to provide four marketed turbo molecular pumps of a capability of 50 l/min or the like at the bottom side of the sample chamber 58. When an exhaust speed (flow) of approximately 200 l/min is obtained, it takes a few minutes to obtain a degree of vacuum as high as $10^{-5}$ pa even when six wafers are placed on the rotational stage 52.

The rotary stage 52 is vacuum-sealed by means of a magnetic fluid and is supported by an air spindle. With this structure, it is possible to realize an axis deviation of approximately 50 nm. It is possible to reduce a wow and flutter to an extremely low level equal to 0.02% by driving the rotary stage 52 by means of an air spindle motor employing PLL control.

The rotation angle of the rotary stage 52 can be detected by a rotary encoder built in a motor 74 supported by a bearing 73. If it is desired to detect the rotation angle more precisely, a pattern similar to a linear scale is formed on the side of the rotary stage 52 by etching. With this structure, it is possible to obtain an angular resolution of $10^{-6}$–$10^{-7}$ radian. The above resolution level corresponds to a spatial resolution of tens of nanometers to hundreds of nanometers in the circular direction at the outer circumferential portion of the rotary stage 52. The above spatial resolution level is as high as that of the linear scale.

The wafers are placed on the rotary stage 52 by an electrostatic chuck so that the patterns formed on the wafers face downward. With the above placement, it is possible to prevent the pattern surfaces from being contaminated due to physical drop of dust or the like. If the patterns have a large feature scale and is not substantially affected by dust dropped from the chuck mechanism, the objects to be inspected may be held by claw members.

The sensor 54 is placed on the sensor stage 56, which is moved by the motor 56 in the radial direction. Use of a revolution introduction mechanism 135 is less expensive in which the motor 56 is placed outside of the vacuum area and rotation is introduced by the magnetic fluid seal. The stage is moved in the radial direction by means of a ball screw. The stage position can be detected at a precision of tens of nanometers by means of a linear scale. Of course, a laser length measuring machine may be used. However, when taking into consideration the precision of the rotary stage 52 (approximately equal to 50 nm), it is more suitable to use the linear scale.

When an inch-worm motor or a stepping motor suitable for very high vacuum is placed in the sample chamber and is used therein, the revolution introduction mechanism 135 can be omitted, and thus the mechanical system is simplified. However, it will be necessary to use means for suppressing noise due to high-voltage pulses applied to the inch-worm motor and to use shielding means for shielding parasitic magnetic field.

As has been described previously, the load lock mechanism 120 includes the wafer load mechanism 60, the load lock chamber 62 and the gate valve 64. The load lock mechanism 120 provides means for loading and uploading the wafers without breaking the vacuum of the sample chamber 58.

A wafer load mechanism 150 can be configured by slightly modifying a marketed wafer load mechanism using an electrostatic chuck. More particularly, modifications may include when a lubricating oil with a high vapor pressure is used to lubricate the stage or bearings, another lubricating oil suitable for the vacuum environment such as FOMBLIN, a solid lubricating oil such as molybdenum disulfide or bearings suitable for the vacuum environment. If an evaporation of the lubricating oil used in a motor of the wafer load mechanism is expected to cause any problem, a motor suitable for the vacuum environment is used. The occurrent of heat does not cause any serious problem by supplying electricity to the wafer load mechanism 150 only when the wafers are loaded and unloaded.

The load lock chamber 62 is connected to the sample chamber 58 via the gate valve 64, and is connected to the rotary pump 66 via the valve 70. Although not shown for the sake of simplicity, a lid for taking a wafer cassette 78 in and out of the load lock chamber 62, and a leak valve for leaking the load lock chamber 62 are provided.

A description will now be given of a wafer loading/unloading sequence carried out in the case where the sample chamber 58 is already in the vacuum state. When the sample chamber 58 is maintained in the vacuum state, the valves 70 and 72 are maintained in the closed and open states, respectively, and the gate valve 64 is maintained in the closed state.

In order to load the wafer cassette 78 to the wafer load mechanism 60, the load lock chamber 62 is leaked. At this time, the valve 70 is closed and the gate valve 64 is closed. When the leak valve 64 is opened from the closed state, the inner area of the load lock chamber 62 becomes equal to the atmospheric pressure. At the time the inner area of the load lock chamber 62 becomes equal to the atmospheric pressure, the lid of the load lock chamber 62 is opened, and the wafer cassette 78 is loaded to the load lock mechanism 120.

Next, the lid of the load lock chamber 62 is closed and the load lock chamber 62 is exhausted in the state in which the leak valve is closed and the valves 72 and 70 are closed and open, respectively. When the rotary pump system has a capability of approximately 200 l/min, it takes approximately two minutes to exhaust the inner area of the load lock chamber 62 to $10^{-1}$–$10^{-2}$ Pa.

The valve 70 is closed and the gate valve 64 and the valve 72 are opened when a specified time (equal to one to two minutes) elapses after starting to exhaust the load lock chamber 62. Thus, the load lock chamber 62 is rapidly exhausted to a vacuum level in the order of $10^{-4}$ Pa. In this state, the wafers are loaded to the rotary stage 52. When the loading of the wafers is completed, the load lock chamber 62 and the sample chamber 58 are separated from each other. The degree of vacuum of the sample chamber 58 is rapidly recovered to a level in the order of $10^{-5}$ Pa because there is no inflow of gas from the load lock chamber 62 to the sample chamber 58.

When the inspection of the wafers is completed, the gate valve 64 is opened again, and the wafers are returned to the wafer cassette 78 from the rotary stage 52. Then, the gate valve 64 is closed again.

The above procedure is repeatedly carried out and the wafer cassettes are successively replaced, so that patterns formed on pairs of wafers can be inspected.

If the number of wafers allowed to be accommodated in the wafer cassette 78 is larger than (its multiple number) the number of wafers allowed to be loaded to the rotary stage 52, it is possible to reduce the number of times that the load lock chamber 62 is leaked.

It is desirable that the rotary pump 66 of the vacuum exhaust mechanism 130 has a capability of approximately 200 l/min, and the turbo molecular pump 68 consists of three or four pumps each having a capability of 50 l/min. If the overall structure of the inspection device is allowed to have a larger size, it is possible to use a single turbo molecular pump having a capability of 200–300 l/min and to reduce the cost for assembling the device.

The valves 70 and 72 are suitably formed of less-expensive valves having a large conductance, such as butterfly valves. Regarding the frame 140, it is necessary to take into consideration isolation from vibration of the rotary pump 66. It is possible to employ a mechanism preventing the transmission of vibration. For example, a damper is provided between the chambers 62 and 58 and the frame 140. The passages between the rotary pump 66 and the load lock chamber 62 and the rotary pump 66 and the turbo molecular pump 68 are formed of light, flexible pipes.

Example of the Structure of the Sensor 54

Figure 4:
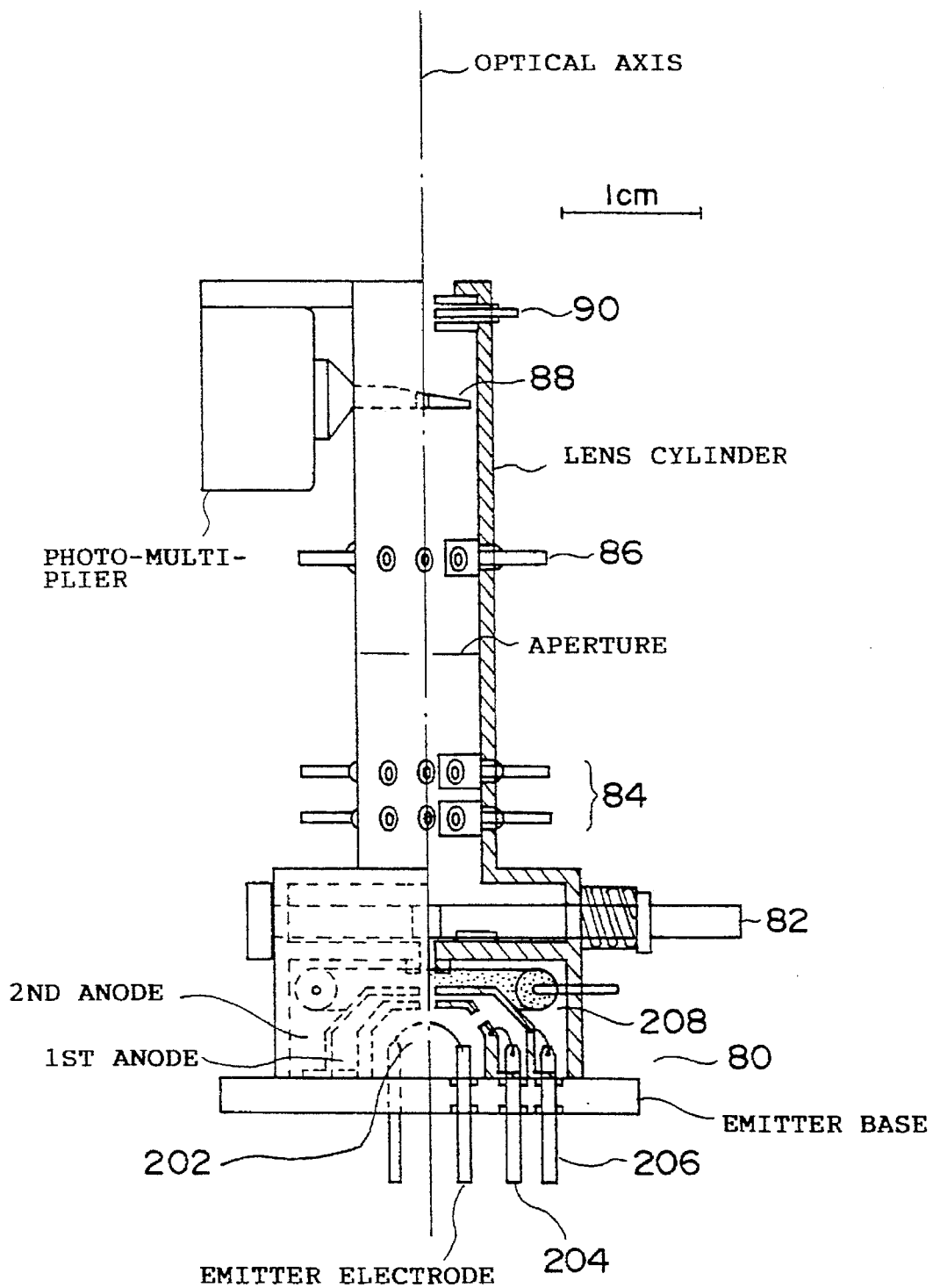
FIG. 4 is a side view of a sensor used in the mechanical structure system shown in FIG. 3, the side view having a partially cutaway cross-sectional view.

FIG. 4 is a diagram of an example of the structure of the sensor 54. The sensor 54 is basically the same as the scanning-type electron microscope (SEM).

The sensor 54 includes an electron gun part 80, an electron gun isolation mechanism 82, an eight-electrode deflector (two stages) 84 for gun alignment, an eight-electrode deflector 86 for deflection scan, a detector 88 and an objective lens 90.

The electron gun part 80 includes an emitter 202, a first anode electrode 204, a second anode electrode 206 and a vacuum pump 208. The scanning-type electron microscope for pattern inspection uses an electric field emission type electron gun by a thermal field emitter (TFE) or a cool field emitter (CFE). When the electron gun (emitter) based on the electric field emission is used, it is necessary to maintain the vicinity of the emitter at a vacuum level in the order of $10^{-7}$ Pa. In order to maintain the outside of the sensor 54 at a vacuum level better than $10^{-5}$ Pa, an increased device size and cost is needed. With the above in mind, it is necessary to obtain a vacuum level in the order or $10^{-7}$ by differential exhaust for the electron gun part 80.

The vacuum pump 208 for the electron gun part 80 is appropriately formed of a getter pump of a reservoir type or evaporation type because these type of pumps have a compact size, a large exhausting rate and a high vacuum level. In FIG. 4, a reservoir type getter pump (which has the trade name NEG) is used as the vacuum pump 208. The NEG has a large degree of freedom in forming and can be used as a pump only by applying electricity across a filament and activating it. With the NEG, it is expected to obtain an exhausting rate equal to or higher tan 1 l/sec. Hence, it is possible to generate a two-digit pressure difference by setting the diameter of an orifice provided in the electron gun isolation mechanism to approximately 300–500µm.

No problem of performance will arise if the evaporation type getter pump is used. If a Ti film is deposited to a large thickness by evaporation, the deposited Ti film may flake off and thus an electrode is inhibited from being placed below the evaporation surface. In order to prevent Ti from being deposited to the emitter or anode, it is necessary to provide a shutter member.

A sufficient bias is applied to the first anode electrode 204 in order to cause emission of the electric field to occur at the end of the emitter. A voltage applied to the second anode electrode 206 depends on the lens performance of the electron gun part 80. By varying the voltage applied to the second anode electrode 206 to change the aperture angle of the electron beam, it is also possible to control the beam current.

The electron gun isolation mechanism 82 can be attained by closing the orifice by sliding an O ring by Viaton. In a case where the O ring has a diameter of approximately 3 mm and is deformed by 30%, force having a magnitude of approximately 1 Kg is needed to slide the O ring.

As shown in FIG. 4, by supporting a rod having the O ring and a beam passage aperture by a spring having a capability slightly greater than 1 Kg, it becomes possible to allow the electron beam to pass through the beam passage aperture and the orifice when the rod is free to move. When the rod is held from the right side by force having a magnitude equal to 2 Kg, it is possible to move the O ring leftward to close the orifice by the O ring. A mechanism for holding the rod is constructed so that the rod is arranged in the direction horizontal to the movement direction of the stage 52 and a projection is provided on the side surface of the sample chamber 58. When the stage 52 is moved to a far-side position along the radial direction of the stage 52, the projection presses the rod.

The gun alignment electrode 84 deflects the electron beam so that the electron beam is correctly incident to the aperture from the electron gun 80. The beam current is limited by the aperture and the position of the electron beam is corrected by the deflector 86 by the deflection scan. Then, the electron beam is focused on the sample surface by means of the objective lens 90.

The secondary electrons (reflected electrons) emitted from the sample are detected by the detector 88, which is the combination of a light pipe coated with a scintillator and a photo-multi-plier. With the above structure, it is possible to obtain a range of approximately 50 MHz. It is necessary to connect about 30 electricity supply wiring lines to the sensor 54, these wiring lines including a high-voltage wiring lines which carries a voltage equal to 5 kV at maximum, a current wiring line which carries a current of a few amperes to the vacuum pumps and high speed transferring wiring lines which carry a secondary electron signal and signals for the deflection scan.

It is necessary to lay the wiring lines so that stress is not applied to the sensor and the arrangement of the wiring lines is not destroyed even when the sensor stage 56 is moved. It is possible to prevent stress from being applied to the sensor when all the wiring lines are received and fastened to the stage. It is possible to prevent the arrangement of the wiring lines from being destroyed when the low-speed signal lines and the current lines are connected to a flat cable made of polyimide on the stage 56 and are connected to a connector of hermetic seal provided on the side wall of the sample chamber 58. With the above arrangement, it becomes possible to reduce the number of wiring lines to 10. The current lines are connected to a few lines of the flat cable. When the flat cable is specially ordered, it becomes possible to take into consideration the frequency characteristic and the crosstalk characteristic. Since the high-speed signals are transmitted via the flat cable, it is possible to reduce the number of wiring lines to approximately five. The high-voltage wiring lines can be Teflon-coated wiring lines. Since the Teflon-coated wiring lines are flexible, it is easily possible to extend them along the flat cable so that they are mechanically unified with the flat cable.

Control System 300

Figure 5:
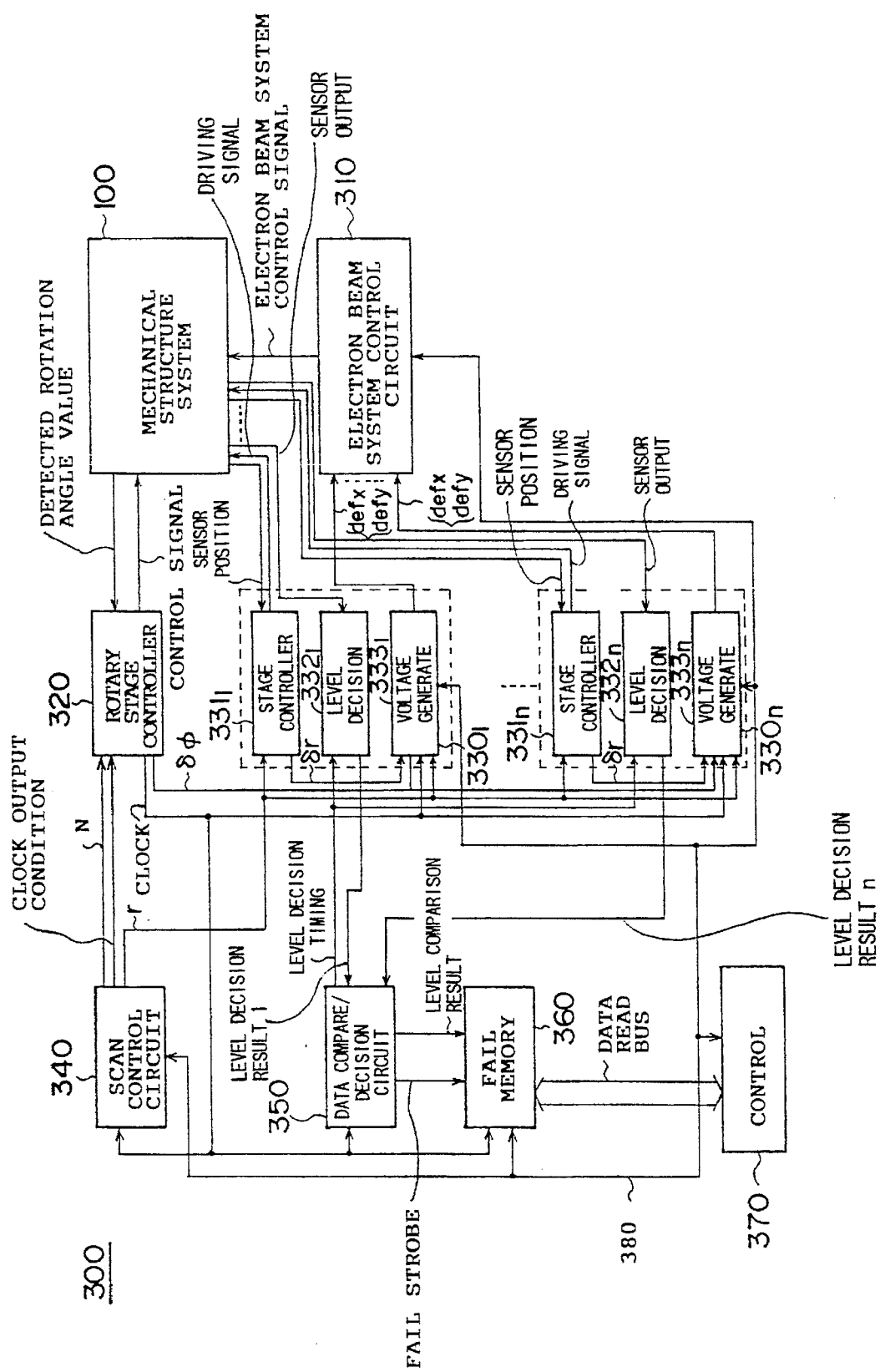
FIG. 5 is a block diagram of a control system of an inspection device according to an embodiment of the present invention.

FIG. 5 shows a control system 300, which is mainly made up of an electron beam system control circuit 310, a rotary stage controller 320, a sensor control circuit $330_1$–$330_n$, a scan control circuit 340, a data comparison/decision circuit 350, a fail memory 360 and a control computer 370.

The aforementioned mechanical structure system 100 is connected to the rotary stage controller 320, the sensor control circuit $330_1$–$330_n$ and the electron beam system control circuit 310. The rotary stage 52 is controlled by a control signal output by the rotary stage controller 320, and the rotary stage controller 320 is informed of the detected rotation angle by the mechanical structure system 100.

Electron beam system control signals are used to define the operations of the electron gun part 80, the gun alignment electrode 84, the objective lens 90, the electron beam deflector 86, the detector 88, the vacuum pump 208 and so on.

Interface signals interfaced with the sensor control circuits $330_1$–$330_n$ include a signal indicating the sensor position, a sensor driving signal and a sensor output signal. These interface signals are grouped for each sensor. The sensor position is a measurement value indicating the position of the related sensor (stage) detected by the linear scale. The driving signal is a stepping motor driving pulse for driving the stage 56. The sensor output signal is an analog signal output by the detector (PMT detector) 88.

The electron beam system control circuit 310 is connected to the mechanical structure system 100, a deflection correction voltage generating circuit $333_1$–$333_n$, and the control computer 370. Signals are supplied to the mechanical structure system 100 from the electron beam system control circuit 310. These signals function to define the operations of the electron gun part 80, the gun alignment electrode 84, the objective lens 90, the electron beam deflector 86, the detector 88, the vacuum pump 208 and so on. The deflection correction voltage generating circuit $333_1$–$333_n$ are equal in number to the sensors. The electron beam system control circuit 310 receives, from the deflection correction voltage generating circuits $333_1$–$333_n$, deflection correction amount data defx related to the X direction and deflection correction amount data defy related to the Y direction, and produces deflection voltages corresponding to the deflection correction amount data defx and defy. The deflection voltages are applied to the deflector 86 having eight electrodes for the deflection scan of the electron beam probe. The electron beam system control circuit 310 is connected to the control computer 370 via a general-purpose bus 380. The electron beam system control circuit 310 receives the operation setting signals defining the operations of the electron gun part 80, the gun alignment electrode 84 having eight electrodes, the objective lens 90, the detector 88, the vacuum pump 208 and so on, and control the mechanical structure system 100 on the basis of the received operation setting signals.

The rotary stage controller 320 is connected to the mechanical structure system 100, the deflection correction voltage generating circuits $333_1$–$333_n$, the scan control circuit 340, the data comparison/decision circuit 350 and the fail memory 360. A control signal for driving the rotary stage 52 is supplied to the mechanical structure system 100 from the rotary stage controller 320. The rotary stage controller 320 is informed of the detected rotation angle value.

The rotary stage controller 320 receives the revolution number N (r.p.m.) and data indicating a clock output condition from the scan control circuit 340. The rotary stage controller 320 generates the control signal which causes the rotary stage to be rotated at the revolution speed N. The rotary stage controller 320 monitors the rotation angle, and starts to generate a clock when a deviation $\delta\phi$ between the target rotation angle and the detected rotation angle falls within a predetermined range. The deviation $\delta\phi$ is supplied to the deflection correction voltage generating circuits $333_1$–$333_n$ associated with the sensors, and are used to produce the deflection correction voltages.

The clock indicates the target value of the stage rotation angle. The comparison/decision circuit 350 multiplies the clock to thereby produce a sampling timing. The fail memory 360 is used to produce a strobe signal for incrementing a memory address due to the multiplication of the clock. The deflection correction voltage generating circuits $333_1$–$333_n$ use the clock as timings at which the respective deflection correction voltages are generated.

The sensor control circuits $330_1$–$330_n$ are made up of the stage controller $331_1$–$331_2$, level decision circuits $332_1$–$332_n$ and the deflection correction voltage generating circuits $333_1$–$333_n$. The sensor control circuits $330_1$–$330_n$ are equal in number to the sensors (n sensors).

The stage controllers $331_1$–$331_n$ control the sensor stage 56 moved in the radial direction, and is connected to the scan control circuit 340, the mechanical structure system 100 and the deflection correction voltage generating circuits $333_1$–$333_n$. The scan control circuit 340 notifies the stage controllers $331_1$–$331_n$ of the specified sensor position r. The stage controller $331_1$–$331_n$ compares the specified sensor position r from the scan control circuit 340 with the detected sensor position from the mechanical structure system 100, and produces a sensor stage driving signal which causes a deviation $\delta r$ between the specified sensor position and the detected sensor position to become zero. The deviation $\delta r$ is supplied to the deflection correction voltage generating circuits $333_1$–$333_n$.

The level decision circuits $332_1$–$332_n$ digitize the sensor outputs, and are connected to the mechanical structure system 100 and the data comparison/decision circuit 350. The level decision circuits $332_1$–$332_n$ digitizes the sensor outputs from the mechanical structure system 100 in synchronism with the strobe signal from the data comparison/decision circuit 350, and outputs the digitized signals to the data compare/decision circuit 350 as the level decision results.

The deflection correction voltage generating circuits $333_1$–$333_n$ generate the deflection correction voltages defx and defy, and are connected to the electron beam system control circuit 310, the rotary stage controller 320, the stage controllers $331_1$–$331_n$, the scan control circuit 340 and the control computer 370. The deflection correction voltage generating circuits $333_1$–$333_n$ supply the deflection correction voltages defx and defy to the electron beam system control circuit 310. The deflection correction voltages can be calculated from wafer position errors $\delta x$, $\delta y$, a wafer rotation error $\delta\Theta$, a stage rotation angle $\phi$, a target wafer center angle $\phi_1$, a stage rotation angle deviation $\delta\phi$, the specified sensor position r and the sensor stage position error $\delta r$. The wafer position errors $\delta x$ and $\delta y$ and the wafer rotation error $\delta\Theta$ are supplied from the control computer 370 via the general-purpose bus 380. The deflection correction voltage generating circuits $333_1$–$333_n$ are informed of the stage rotation angle deviation $\delta\phi$ from the rotary stage controller 320. The specified sensor position r is given to the deflection correction voltage generating circuits $333_1$–$333_n$ from the scan control circuit 340. The sensor stage position error signal $\delta r$ is given to the deflection correction voltage generating circuits $333_1$–$333_n$ from the stage controller $331_1$–$331_n$.

The deflection correction voltages defx and defy can be written as follows:

$$defx \propto -\delta r + R\sin\phi\delta\Theta + \cos\phi\delta x - \sin\phi\delta y$$

$$defy \propto r\delta\phi + (r - R\cos\phi)\delta\Theta + \sin\phi\delta x - \cos\phi\delta y$$

where $\phi = \phi - \phi_1$, $\delta\phi = \delta\phi$, and R denotes the distance from the center of the rotary stage 52 to the center of the wafer.

The scan control circuit 340 controls the rotary stage 52 and the sensor stage 56, and is connected to the rotary stage controller 320, the stage controllers $331_1$–$331_n$ and the control computer 370.

The scan control circuit 340 is informed, from the control computer 370, with an activating signal, a sensor stage scanning range, a clock outputting condition and the revolution number N of the rotary stage 52. The scan control circuit 340 informs the rotary stage controller 320 of the revolution number N and the clock outputting condition. The stage controller 320 outputs the clock to the scan control circuit 340. The scan control circuit 340 informs the stage controllers $331_1$–$331_n$ of the specified sensor position r, which is updated in synchronism with the clock.

The data comparison/decision circuit 350 compares the level decision results obtained by the level decision circuits $332_1$–$332_n$ of the sensor control, and makes a path/fail decision on the basis of the comparison results. The circuit 350 are connected to the level decision circuits $332_1$–$332_n$, the rotary stage controller 320 and the fail memory 360. The data comparison/decision circuit 350 produces a level decision timing signal from the clock signal received from the rotary stage controller 320, and supplies the level decision circuit $332_1$–$332_n$ with the produced level decision timing signal. The level decision circuits $332_1$–$332_n$ refer to the levels of the sensor outputs and make a level decision in synchronism with the level decision timing signal. The data comparison/decision circuit 350 is notified of the level decision results. The data comparison/decision circuit 350 compares the level decision results from the sensor control circuits $330_1$–$330_n$, and outputs a fail strobe signal to the fail memory 360 if the comparison results do not match. Then, the data comparison/decision circuit 350 encodes the content of the fail, and outputs an encoded signal to the fail memory 360 as a level comparison result.

The fail memory 360 is a memory circuit which stores the level comparison results output by the data comparison/decision circuit 350, and is connected to the data comparison/decision circuit 350, the rotary stage controller 320 and the control computer 370. The fail memory 360 receives the fail strobe signal from the data comparison/decision circuit 350, and stores the level comparison result related to the timing defined by the fail strobe signal in combination with the fail address information. The low-order address of the fail address information is produced from the clock signal of the rotary stage controller 320, and the high-order address thereof is provided by the control computer 370 via the general-purpose bus 380. The fail memory 360 itself is connected to the control computer 370 via a high-speed bus specifically designed to read data.

The detail of the structural elements shown in FIG. 5 will now be described.

Rotary Stage Controller 320

Figure 6A:
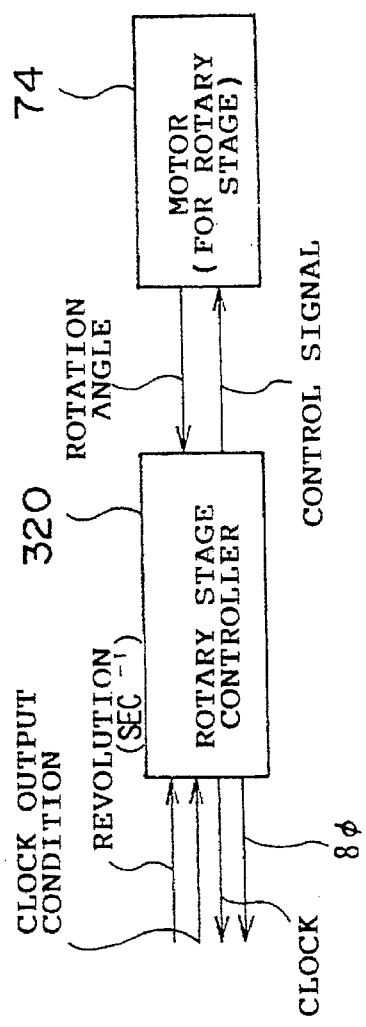
FIG. 6A is a block diagram of a rotary stage controller shown in FIG. 5.
Figure 6B:
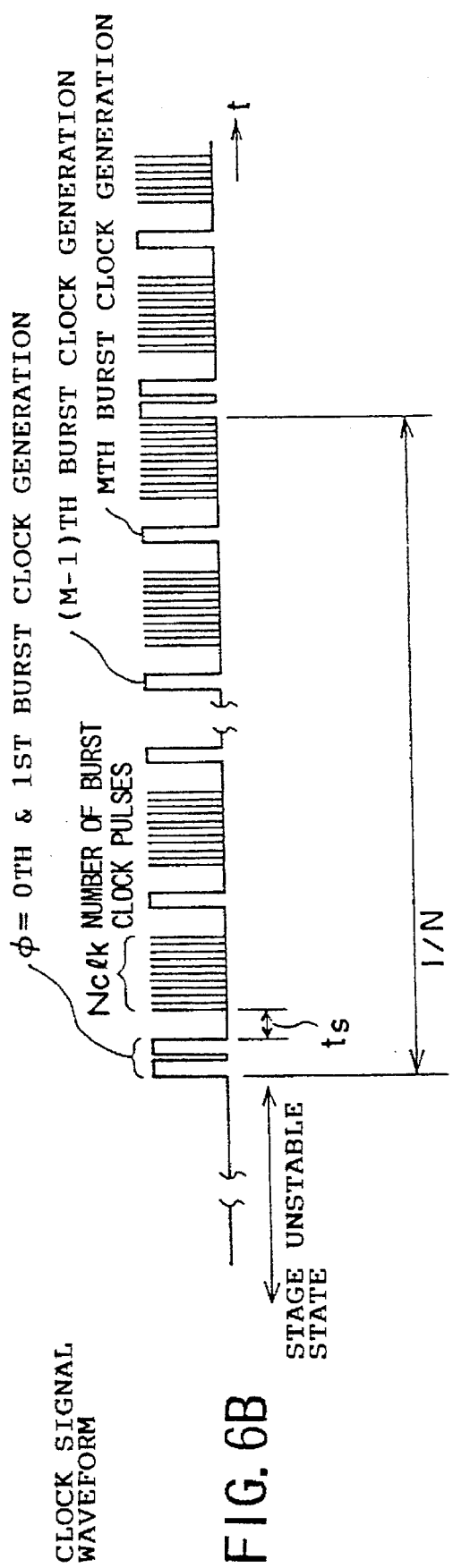
FIG. 6B is a waveform diagram of the operation of the rotary stage controller shown in FIG. 6A.

The clock signal generated by the rotary stage controller 320 will be described with reference to FIGS. 6A and 6B.

When the revolution speed of the rotary stage 52 is settled at the specified value N, the rotary stage controller 320 starts to generate the clock. The starting point ($\phi$=0) of rotation of the rotary stage 52 relates to two consecutive thick pulses. The first pulse indicates the starting point of rotation, and the second pulse indicates the starting timing at which the first burst clock pulse is started. The burst clock pulse is generated from the timing which lags behind the above starting timing by the clock generation starting timing $t_s$. The intervals at which the burst clock pulses are successively generated are equal to an integer multiple of the intervals at which the strobe signal is repeatedly generated (for example, 1 MHz). The burst clock pulses are generated the number of times equal to the number (M) of wafers during the duration equal to the stage rotating cycle 1/N. The pulse indicative of the starting point and the pulse indicating the burst start are generated by using, as a trigger, the output of a rotation angle detecting means such as a rotary encoder. The burst clock pulses can be used as the rotation angle between the pulses indicative of the burst start. The clock generation starting timing $t_s$ and the number of burst clock pulses $N_{clk}$ are given by the control computer 370 as the clock output condition.

Scan Control Circuit 340

Figure 7A:
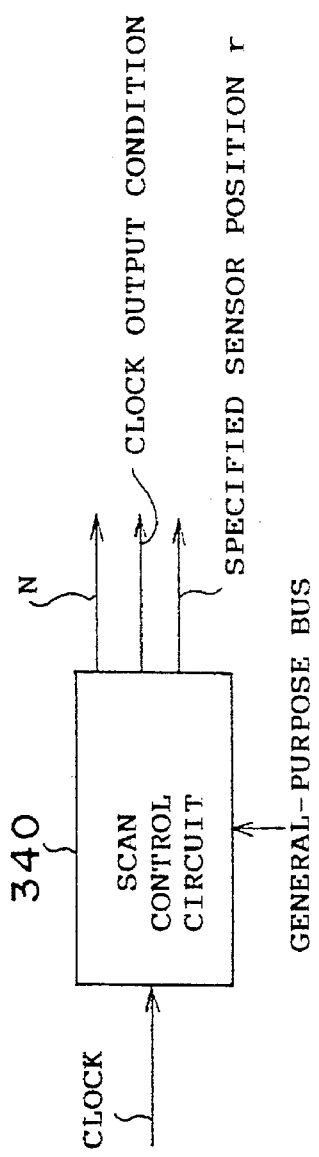
FIG. 7A is a block diagram of a scan control circuit shown in FIG. 5.
Figure 7B:
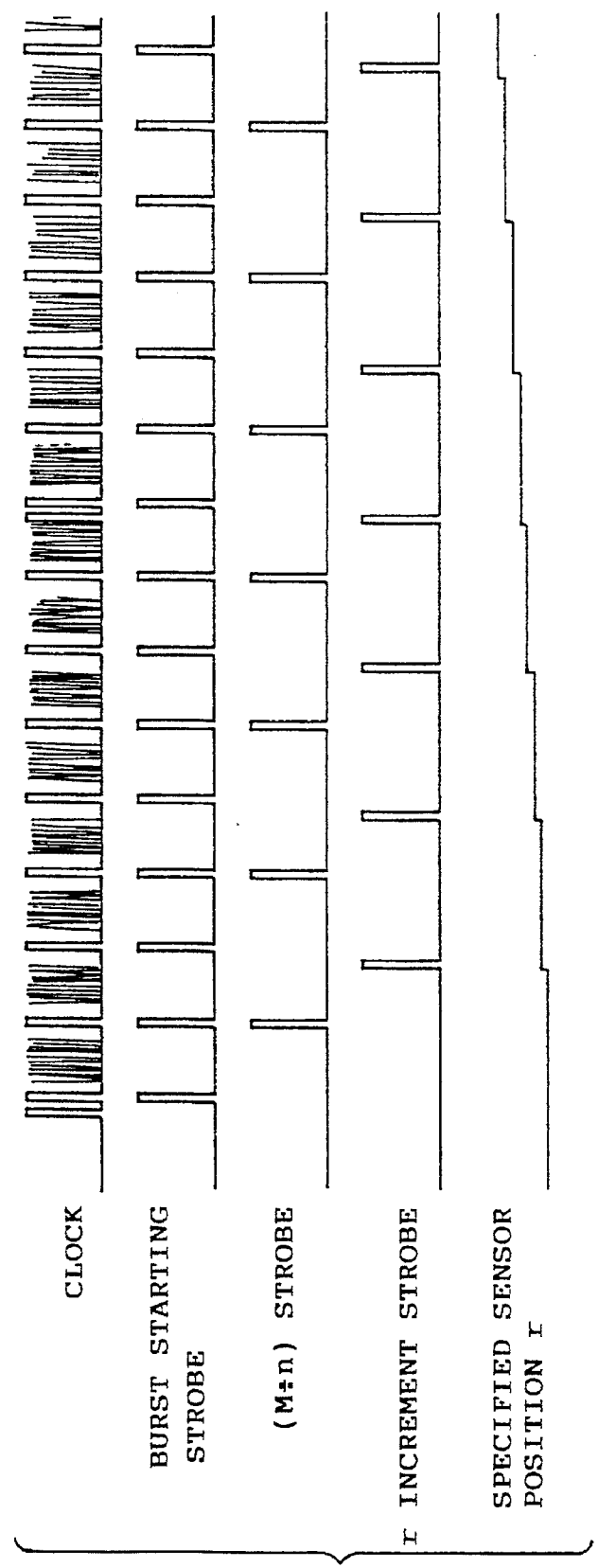
FIG. 7B is a waveform diagram of the scan control circuit shown in FIG. 7A.

FIG. 7A is a diagram of the scan control circuit 340, and FIG. 7B is a timing chart of the operation thereof. More particularly, FIG. 7B shows the updating timing for the specified sensor position r in the scan control circuit 340.

The updating timing of the sensor position is produced by the clock from the rotary stage controller 320. First, the scan control circuit 340 obtains the burst starting strobe signal from the clock. Next, the burst starting strobe signal is frequency-divided (M÷n) where M is the number of wafers placed on the rotary sensor 52 and n is the number of sensors. Hence, by the (M÷n) burst clock pulses, the inspection of the M wafers corresponding to the specified sensor position r is completed. The frequency divided (M÷n) strobe signal is used as an increment strobe for the specified sensor position r. However, the increment strobe for the specified sensor position r is generated when the generation of the subsequent burst strobe signal is ended, Hence, the specified sensor position is updated n times during one revolution of the rotary stage 52.

Stage Controllers $331_1$–$331_n$

Figure 8:
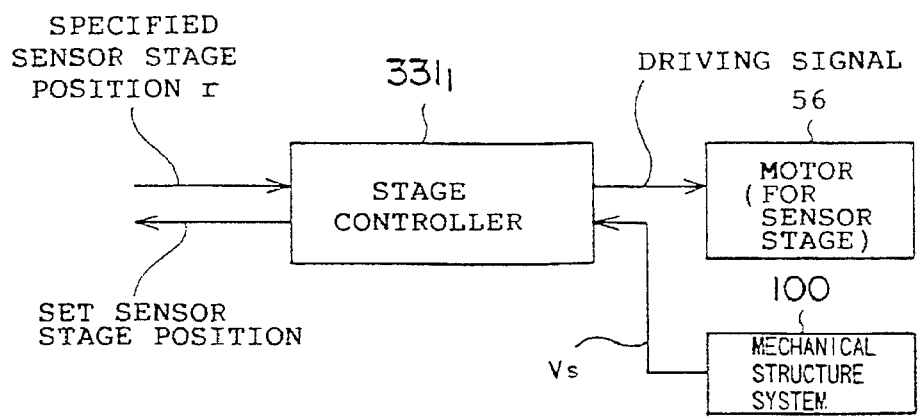
FIG. 8 is a block diagram of a stage controller shown in FIG. 5.

FIG. 8 is a block diagram of the stage controller $331_1$. The stage controller $331_1$ outputs the driving signal to the motor so that the sensor stage 56 is positioned at the specified position. The stage controller $331_1$ receives data indicating the actual stage position $r_a$ from the mechanical structure system 100, and calculates the difference r between the actual position $r_a$ and the specified position r. Then, the stage controller $331_1$ generates the sensor stage position error $\delta r$ corresponding to the difference. The other stage controllers $331_2$–$331_n$ operate in the same manner as described above.

Deflection Correction Voltage Generating Circuits $331_1$–$333_N$

Figure 9:
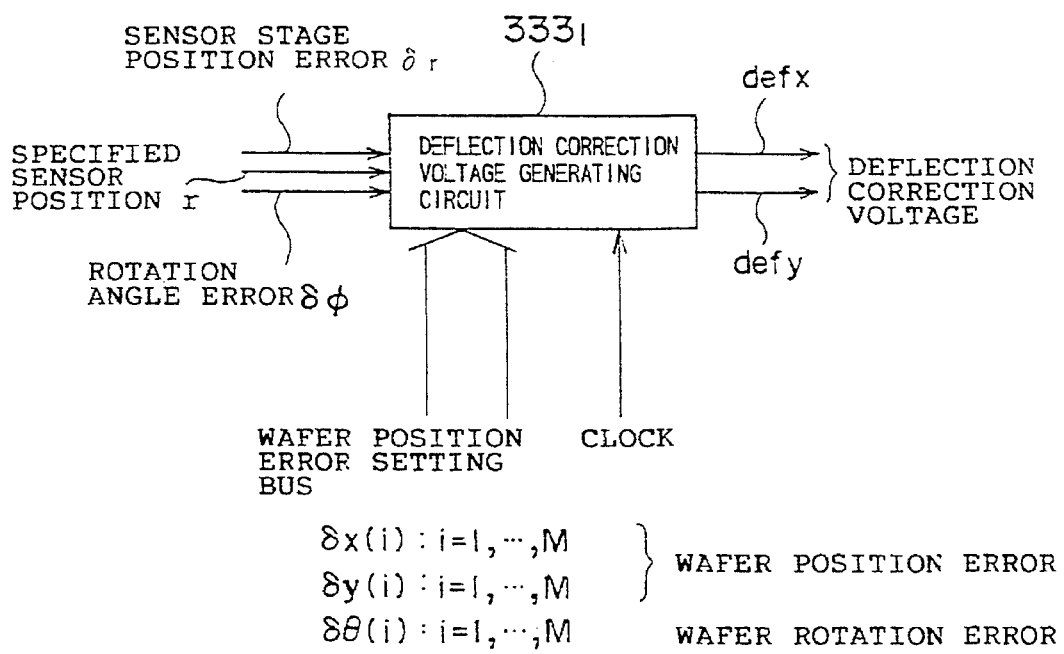
FIG. 9 is a block diagram of a deflection correction voltage generating circuit shown in FIG. 5.

FIG. 9 is a block diagram of the deflection correction voltage generating circuit $333_1$, which generates the deflection correction voltage, which deflects the probe point and corrects a deviation thereof, which may be caused due to an error in the position of the sensor stage 56, an error of the rotation angle of the rotary stage 52, or the misalignment of the wafers. The deflection correction amount is a function of the above errors, the specified sensor position r, the wafer rotation angle $\delta\Theta$ and the distance R between the center of the rotary stage 52 and the center of the wafer. The misalignments of the wafers may differ from each other, and are needed to be stored with respect to the respective wafers. Data indicating the misalignments of the wafers are given by the control computer 370 via the general-purpose bus.

The error of the position of the sensor stage 56 and the error of the rotation angle of the rotary stage 52 fluctuate at a frequency of 10 kHz or lower. Hence, it is enough to generate the deflection correction voltage with the period of the burst clock signal. Hence, a special hardware structure is not needed to generate the deflection correction voltage, which can be realized by a program implemented by an MPU. The other deflection correction voltage generating circuits $333_2$ are configured as described above.

Data Comparison/Decision Circuit 350

Figure 10:
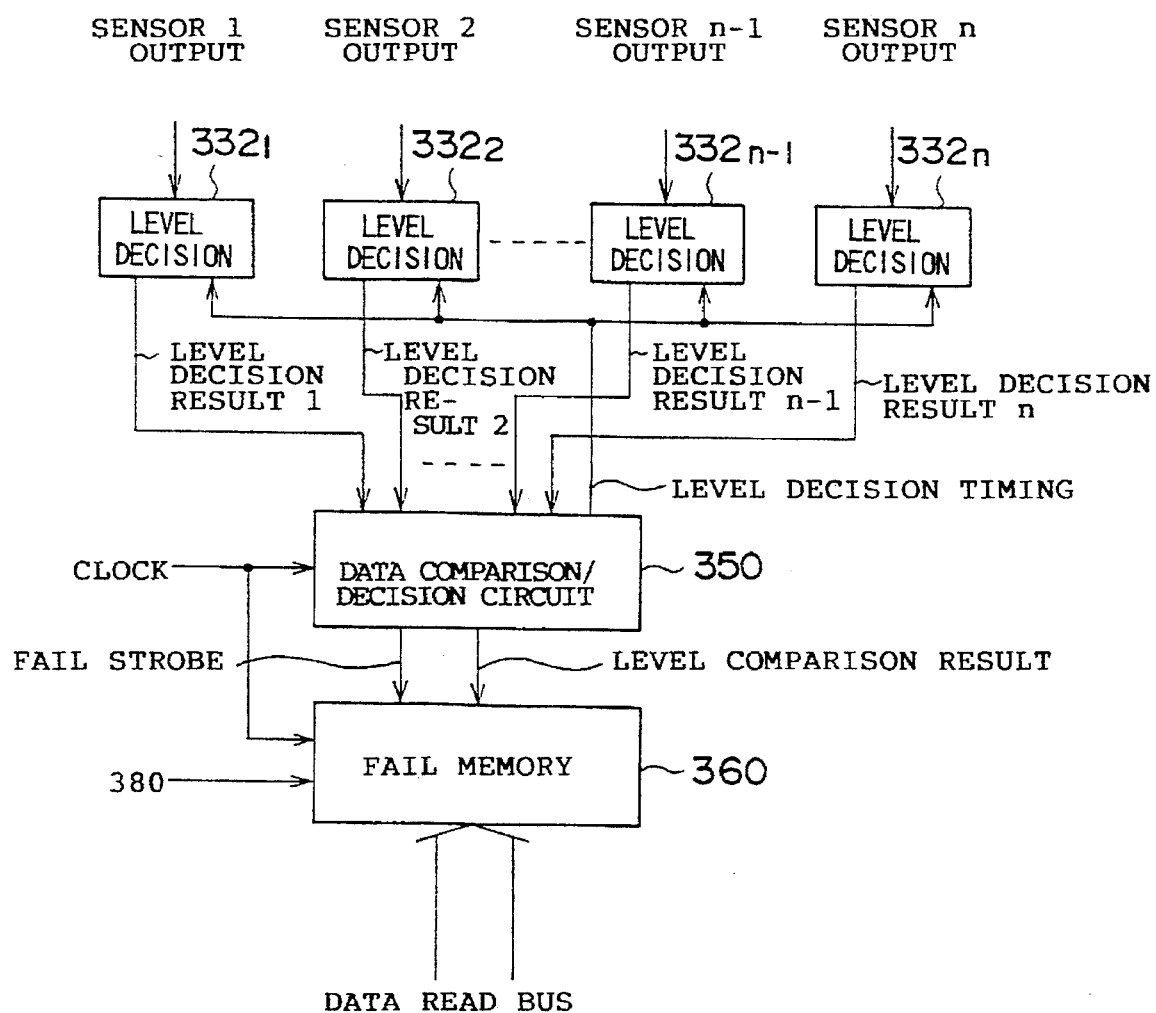
FIG. 10 is a block diagram of a data comparison circuit shown in FIG. 5.

FIG. 10 is a block diagram of the data comparison/decision circuit 350. The data comparison/decision circuit 350 compares the results of the level decision on the output signals of the sensors, and writes encoded comparison result into the fail memory 360 if the comparison result is not normal. The rate at which the level decision is carried out corresponds to a frequency of 40 MHz to 100 MHz. The rate depends on the range of the detector. The level decision timing is generated with reference to the clock. The rate of the clock is, for example, 1 MHz. In this case, a ring oscillator, which starts to oscillate using the clock as a trigger, can be used to generate the level decision timing.

The following relationship must be satisfied among level decision rate J (MHz), the spatial resolution (detectable minimum defect size) Sf (μm), the sensor position r (mm) and the revolution speed N (r.p.m.) of the rotary stage 52:

$$N < (60 \cdot Sf \cdot J)/(2 \times 10^{-3} \pi r).$$

Hence, it is necessary for the revolution speed N to have a small value when the sensor is located on the far side of the rotary stage 52. When the sensor is located on the near side of the rotary stage 52 close to the center thereof, the revolution speed N has a large value. Hence, it is not desirable to maintain the rotary stage 52 at the constant revolution speed in terms of the processing speed. However, it may be difficult to continuously change the revolution speed. It is possible to change the revolution speed several times during the time when the sensor is moving from the far side to the near side. With the above control, the time necessary for the inspection is not much longer than that for the continuous speed control. The storage address of the fail memory 360 can be generated by multiplying the clock as in the case of the level decision timing.

Definition of Error of Wafer Position

Figure 11:
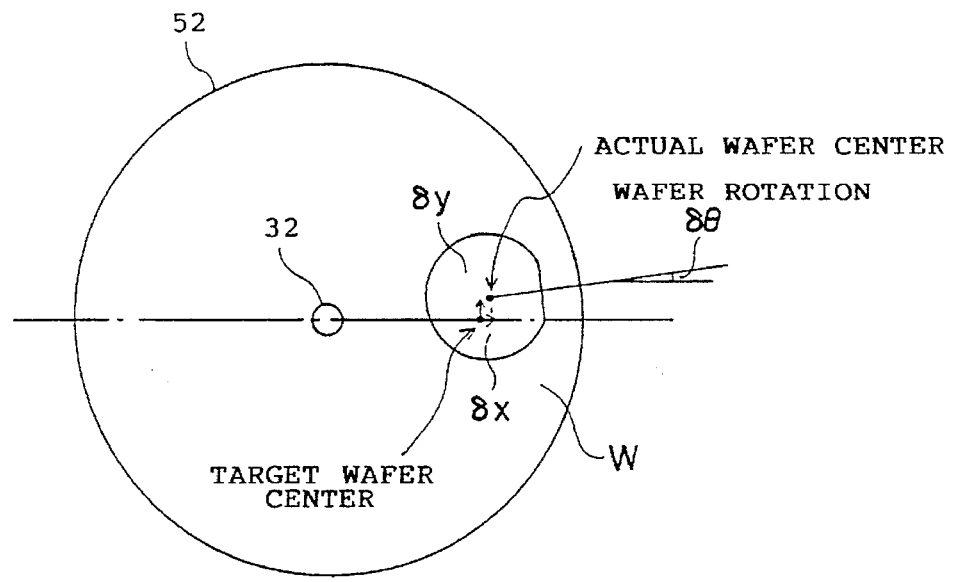
FIG. 11 is a diagram showing the definition of a wafer position error.

FIG. 11 shows the definition of an error of the wafer position. The XY coordinates system is defined so that the X axis passes through the rotary shaft 32 of the rotary stage 52 and the target position Pt of the center of the wafer W. An error between the target position of the center of the wafer W and the real position Pc of the center of the wafer is represented by δx and δy. The rotation angle of the wafer W is represented as δΘ, which has the positive sign in the counterclockwise direction.

Figure 12:
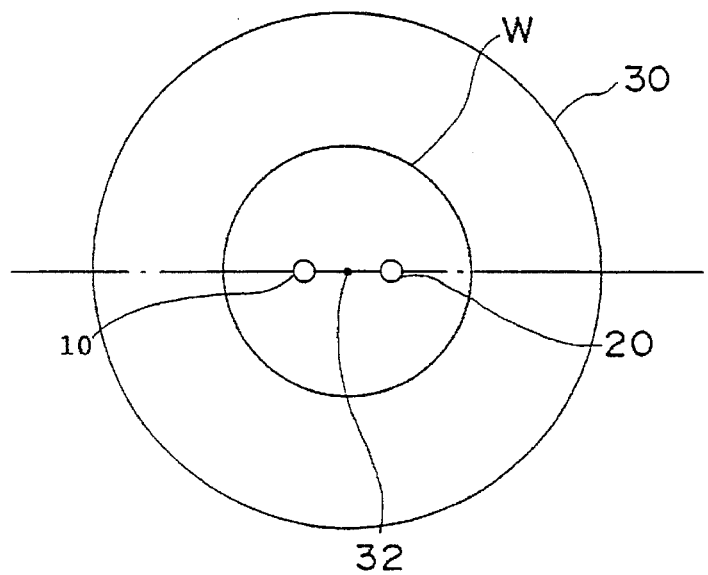
FIG. 12 is a diagram of a structure for inspecting circuit patterns of one wafer according to the embodiment of the present invention.

FIG. 12 is a diagram of a method for detecting a defective circuit pattern on the wafer W. The wafer W is placed on the rotary stage 30, and is scanned by the first sensor 10 and the second sensor 20 in the manner as has been described previously. The circuit patterns formed on the wafer W are symmetrical about the rotary shaft 32.

Figure 13:
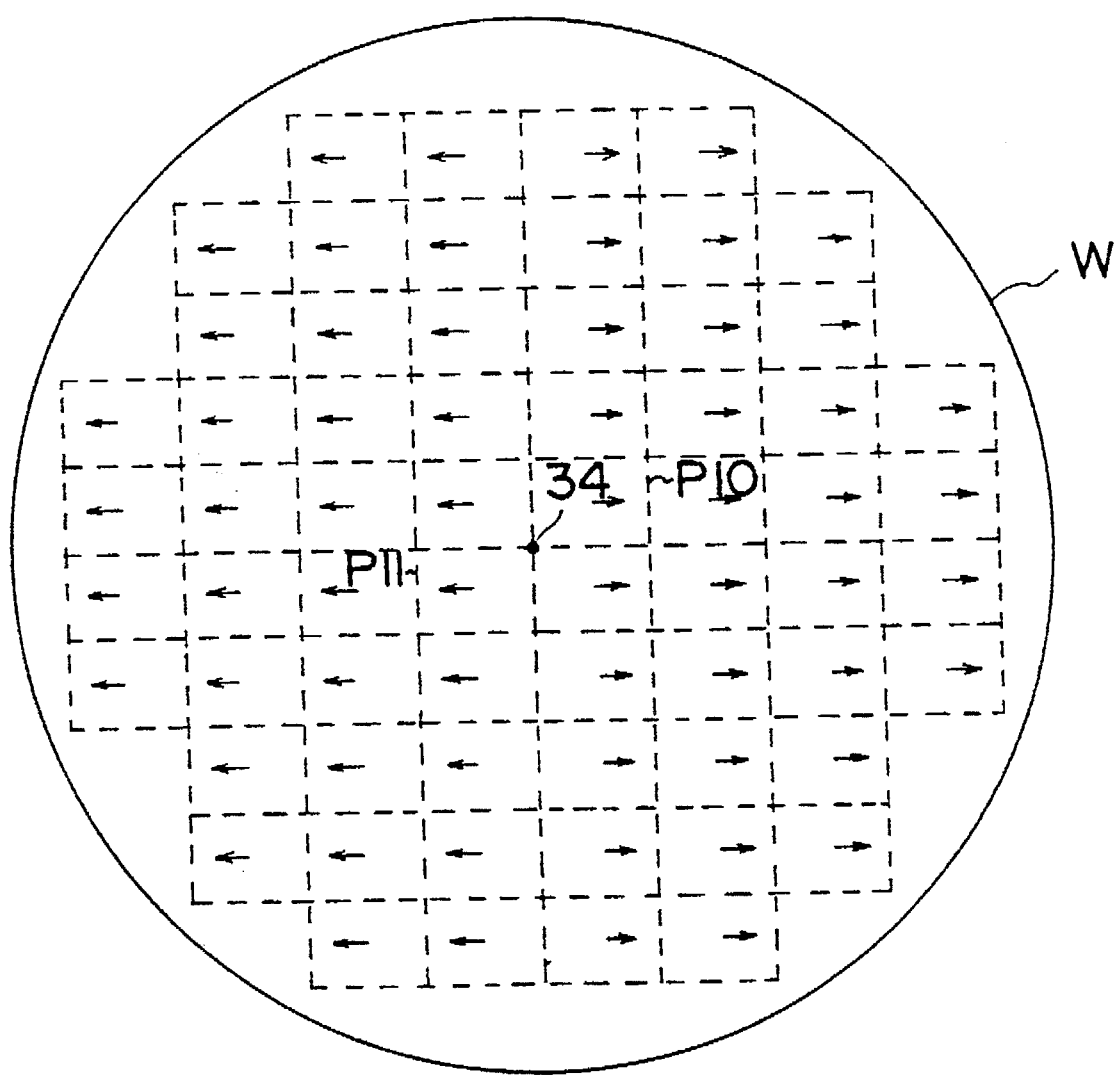
FIG. 13 is a diagram of a wafer having circuit patterns having a rotation symmetry.

FIG. 13 is a plan view of the wafer W having circuit patterns symmetrical about the center 34 thereof. In FIG. 13, blocks depicted by the broken lines denote circuit patterns, and the arrows denote the orientations of the circuit patterns. The circuit patterns are arranged so as to be symmetrical about the center 34 of the wafer W. For example, patterns P10 and P11 are symmetrical about the center 34. The patterns P10 and P11 correspond to respective chips. The center 34 of the wafer W is made to coincide with the center 32 of the rotary stage 30. The first sensor 10 and the second sensor 20 are moved as shown in FIG. 1A, and the stage W is rotated as shown in FIG. 2B. During the above operation, the first sensor 10 produces the output signal S1 as shown in FIG. 2C, and the second sensor 20 produces the output signal S2 as shown in FIG. 2D. The signal processing circuit 40 processes the output signals S1 and S2 in the manner as has been described previously, so that a defective pattern formed on the wafer W can be detected.

The arrangement shown in FIG. 13 has the identical circuit patterns, but are oriented in the two directions. Hence, it is necessary to rotate the exposure stage on which the wafer W is placed or a reticle (or a mask for exposure) by 180°.

Figure 14:
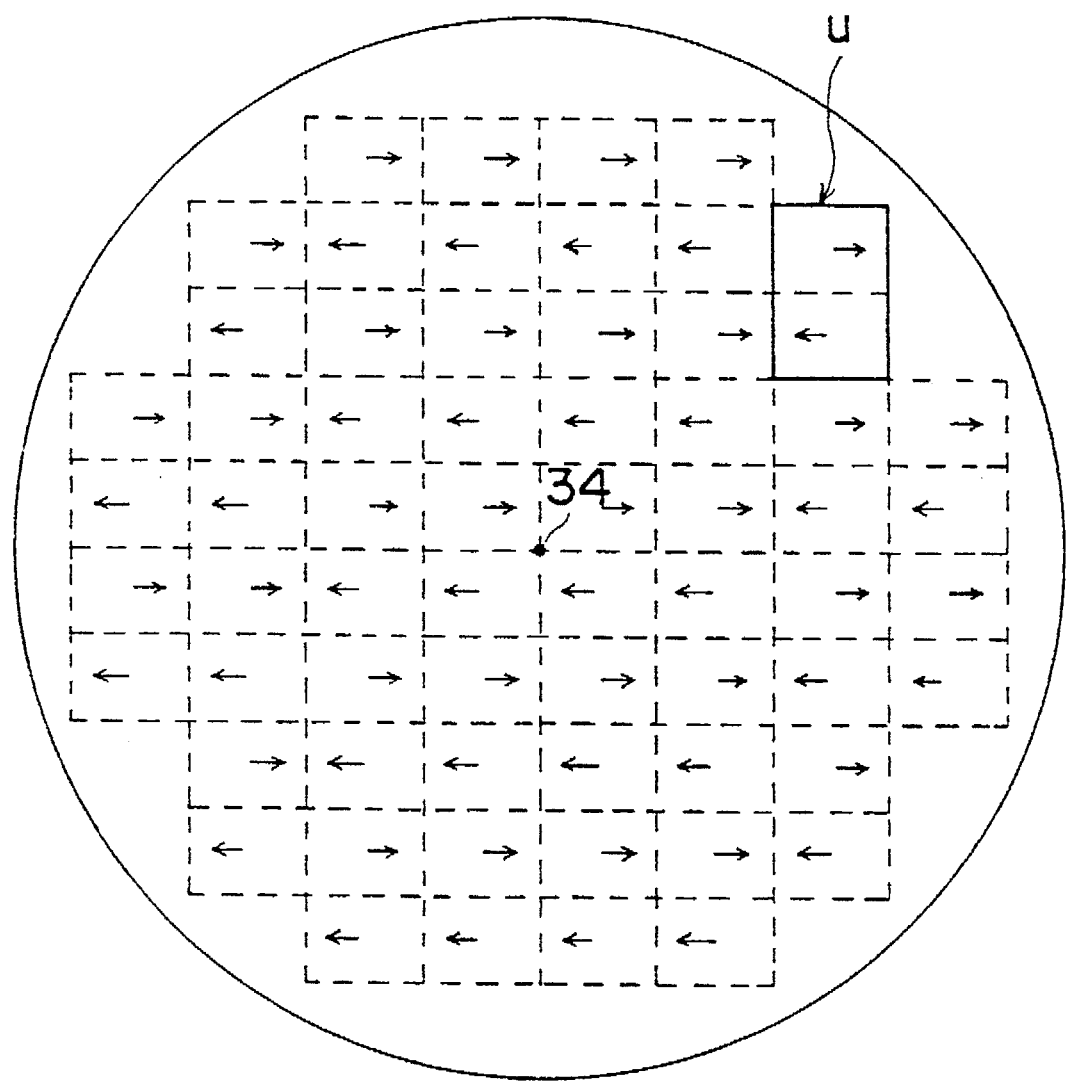
FIG. 14 is a diagram of another wafer having circuit patterns having another rotation symmetry.
Figure 15:
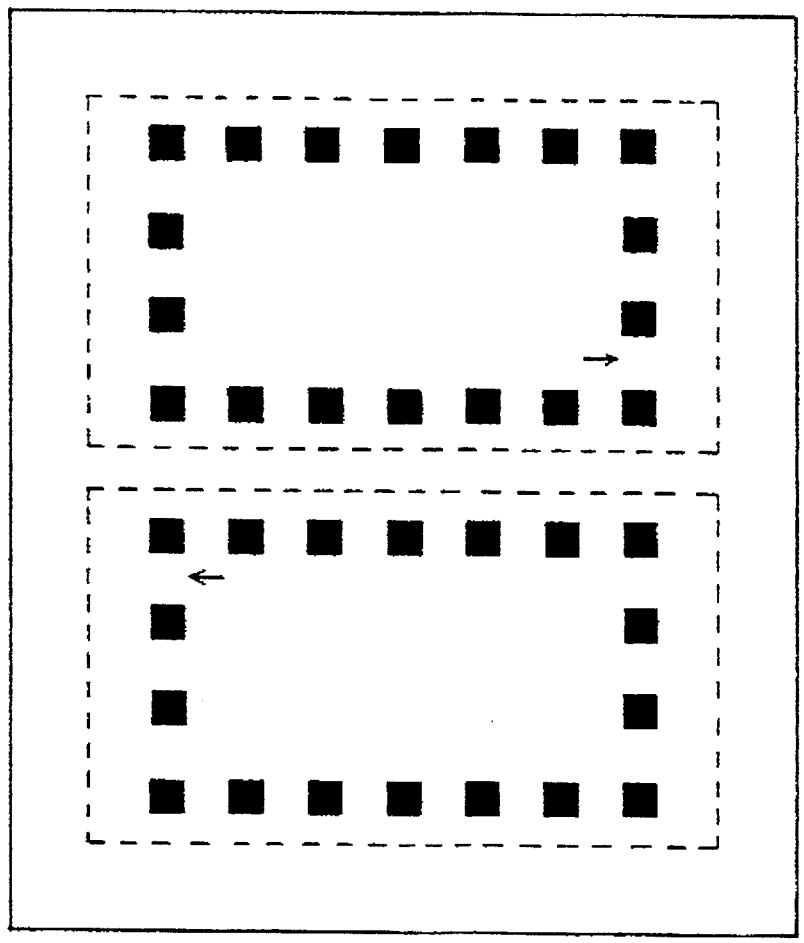
FIG. 15 is a diagram of a reticle having patterns having a rotation symmetry.

FIG. 14 is a plan view of another wafer having circuit patterns symmetrical about the center 34. Unit areas U, which can be exposed by a single movement of the stepper, are arranged so as to be symmetrical about the center 34. Each of the unit areas U has two patterns (which correspond to semiconductor chips) arranged in the opposite directions. FIG. 15 shows an example of a reticle used to expose the unit area U. By rotating one of the two patterns of the reticle by 180°, the rotated pattern becomes identical to the other pattern. Since the exposure is carried out for each unit area U, it is not necessary to rotate the exposure stage or the reticle (or mask) by 180°. However, when the chips are mounted and packaged, it is necessary to rotate half the chips.

The above explanation relates to the inspection of circuit patterns formed on the wafer. However, the above structure and process can be applied to an inspection of the reticle or mask shown in FIG. 15 and printed circuit boards. In the above description, the sensor detects the secondary electrons or reflected electrons. If the printed circuit boards are inspected, it will be preferable to use a sensor which senses light. In the above description, a plurality of sensors are moved. Instead, a plurality of line sensors such as line sensors 12 and 22 as shown in FIG. 16 can be used. In this case, the operation shown in FIG. 2A can be realized by performing the pixel-based scan (drive) so that pixels of the line sensors 12 and 22 synchronized with each other are successively driven. Such line sensors themselves are known, and hence a detailed description thereof will be omitted here.

As shown in FIGS. 17A and 17B, a plurality of pairs of sensors ($15_1$, $15_2$), ($15_3$, $15_4$) and ($15_5$, $15_6$) can be used. All the sensors are movably provided along the lines passing through the rotary shaft 32. A signal processing circuit 40A receives output signals S1–S6 of the sensors $15_1$, $15_2$, $15_3$, $15_4$, $15_5$ and $15_6$, and performs the signal processing shown in FIGS. 2A through 2E. The signal processing circuit 40A can perform the inspection on the basis of the majority operation. If the number of output signals equal to or less than a predetermined number (minority), it is determined that the sensors producing these output signals are defective. The line sensors shown in FIG. 16 can be applied to the structure shown in FIG. 17.

The present invention is not limited to the specifically disclosed embodiments and various variations and modifications may be made without departing from the scope of the present invention.

What is claimed is:

1. A circuit pattern inspection device comprising:
    a stage on which circuit patterns to be inspected are arranged so as to be symmetrical about a center of the stage about which the stage is rotatable;
    a plurality of sensors which are positioned at respective, different positions relatively to the center and which scan the circuit patterns; and
    a signal processing circuit which determines whether or not the circuit patterns are normal on the basis of respective output signals of the plurality of sensors.

2. The circuit pattern inspection device as claimed in claim 1, wherein:
    the plurality of sensors comprises at least one pair of sensors; and
    the sensors of each pair are linearly moved at a common speed in respective, opposite directions relatively to the center.

3. The circuit pattern inspection device as claimed in claim 1, wherein the plurality of sensors comprises at least one pair of line sensors.

4. The circuit pattern inspection device as claimed in claim 1, wherein said signal processing circuit comprises means for comparing the respective output signals of the plurality of sensors and determining that there is a defective circuit pattern when a difference between the respective output signals exceeds a predetermined level.

5. The circuit pattern inspection device as claimed in claim 1, wherein said signal processing circuit performs a majority operation on the respective output signals of the plurality of sensors and determines whether there is a defective circuit pattern or defective circuit patterns sensed by one or more sensors when the respective output signal or signals produced thereby belong to a minority.

6. The circuit pattern inspection device as claimed in claim 1, wherein the circuit patterns comprise patterns formed on a selected one of wafer, a mask for exposure, a reticle and a printed circuit board.

7. The circuit pattern inspection device as claimed in claim 1, wherein the circuit patterns comprise circuit patterns formed on selected ones of wafers, masks for exposure, reticles and printed circuit boards aligned with the center.

8. A method for inspecting circuit patterns comprising the steps of:
  (a) rotating a stage on which circuit patterns to be inspected are arranged so as to be symmetrical about a center of the stage;
  (b) scanning the circuit patterns by a plurality of sensors which are positioned at respective locations relatively to the center; and
  (c) determining whether or not the circuit patterns are normal on the basis of respective output signals of the plurality of sensors.

9. The method as claimed in claim 8, where:
  the plurality of sensors comprises at least one pair of sensors; and
  the step (b) further comprises the step of linearly moving the sensors of each pair at a common speed in respective, opposite directions relatively to the center.

10. The method as claimed in claim 8, wherein:
  the plurality of sensors comprises at least one pair of line sensors; and
  the step (b) further comprises the step of successively driving pixels of the line sensors to scan the circuit patterns.

11. The method as claimed in claim 8, wherein the step (c) further comprises the step of comparing the respective output signals of the plurality of sensors and determining whether there is a defective circuit pattern when a difference between the output signals exceeds a predetermined level.

12. The method as claimed in claim 8, wherein the step (c) further comprises the step of performing a majority operation on the respective output signals of the plurality of sensors and determining that there is a defective circuit pattern or defective circuit patterns sensed by one or more sensors when the respective output signal or signals produced thereby belong to a minority.

13. The method as claimed in claim 8, wherein the circuit patterns comprise patterns formed on a selected one of a wafer, a mask for exposure, a reticle and a printed circuit board.

14. The circuit pattern inspection device as claimed in claim 8, wherein the circuit patterns comprise patterns formed on selected ones of wafers, masks for exposure, reticles and printed circuit boards aligned with the center.

* * * * *

UNITED STATES PATENT AND TRADEMARK OFFICE
CERTIFICATE OF CORRECTION

PATENT NO. : 5,641,960
DATED : June 24, 1997
INVENTOR(S) : OKUBO et al.

It is certified that error appears in the above-identified patent and that said Letters Patent is hereby corrected as shown below:

Col. 10, line 45, amend the two equations to read as follows:

-- $\text{defx} \propto -\delta r + R\sin\varphi \delta\theta + \cos\varphi \delta x - \sin\varphi \delta y$ $\text{defy} \propto -r\delta\varphi + (r - R\cos\varphi)\delta\theta + \sin\varphi \delta x + \cos\varphi \delta y$ --.

line 48, change "$\phi = \phi - \phi_1, \delta\phi = \delta\phi$" to --$\varphi = \phi - \phi_1, \delta\varphi = \delta\phi$--.

Signed and Sealed this

Eleventh Day of November, 1997

Attest:

BRUCE LEHMAN

*Attesting Officer*  *Commissioner of Patents and Trademarks*